(12) United States Patent
Dotta et al.

(10) Patent No.: US 6,353,263 B1
(45) Date of Patent: Mar. 5, 2002

(54) SEMICONDUCTOR DEVICE AND MANUFACTURING METHOD THEREOF

(75) Inventors: Yoshihisa Dotta, Nara; Yasuyuki Saza, Tenri; Kazuo Tamaki, Soraku-gun, all of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/517,510

(22) Filed: Mar. 2, 2000

(30) Foreign Application Priority Data

Apr. 14, 1999 (JP) .............................. 11-107106

(51) Int. Cl.$^7$ .................. H01L 23/48; H01L 23/52; H01L 29/40
(52) U.S. Cl. .................. 257/777; 257/783; 257/685; 257/686
(58) Field of Search ................. 257/777, 778, 257/783, 723, 781, 784, 686, 685; 438/618, 108, 614; 628/180.2

(56) References Cited

FOREIGN PATENT DOCUMENTS

| JP | 57-31166 | * | 2/1982 | ................. 257/777 |
| JP | 4-99056 | * | 3/1992 | ................. 257/777 |
| JP | 5-47998 | * | 2/1993 | ................. 257/777 |
| JP | 5-343609 | * | 12/1993 | ................. 257/777 |

OTHER PUBLICATIONS

Japanese Kokai (Published unexamined patent application) No. 84128/1988 (Tokukaisho 63–84128, Published Date: Apr. 14, 1988).

Japanese Kokai (Published unexamined patent application) No. 47998/1993 (Tokukaihei 5–47998, Published Date: Feb. 26, 1993).

Japanese Kokai (Published unexamined patent application) No. 326710/1995 (Tokukaihei 7–326710, Published Date: Dec. 12, 1995).

* cited by examiner

*Primary Examiner*—Jhihan B Clark
(74) *Attorney, Agent, or Firm*—Nixon & Vanderhye, P.C.

(57) ABSTRACT

When a first semiconductor chip is installed on a circuit substrate by using an anisotropic conductive bonding agent, one portion thereof is allowed to protrude outside the first semiconductor chip. A second semiconductor chip is installed on the first semiconductor chip and a support portion formed by the protruding resin. The protruding portion of the second semiconductor chip is supported by the support portion from under. Thus, in a semiconductor device having a plurality of laminated semiconductor chips in an attempt to achieve a high density, even when, from a semiconductor chip stacked on a circuit substrate, one portion of a semiconductor chip stacked thereon protrudes, it is possible to carry out a better wire bonding process on electrodes formed on the protruding portion.

4 Claims, 12 Drawing Sheets

SEMICONDUCTOR DEVICE AND MANUFACTURING METHOD THEREOF

FIELD OF THE INVENTION

The present invention relates to a semiconductor device and a manufacturing method thereof, and more particularly concerns a manufacturing method and a structure of a semiconductor device which is allowed to have a high density by stacking a plurality of semiconductor chips.

BACKGROUND OF THE INVENTION

In recent years, along with the miniaturization of semiconductor devices, semiconductor devices which are miniaturized virtually to a chip size have been developed. This miniaturized structure of the semiconductor device is referred to as the CSP (Chip Size Package) structure.

FIGS. 10(a) and 10(b) show examples of semiconductors having the CSP structure.

In the semiconductor device of the CSP structure as shown in FIG. 10(a), a semiconductor chip 50 is installed on a circuit substrate with its surface (hereinafter, referred to as "active face") having active elements (not shown) such as transistors formed thereon facing up (face-up bonding). Electrodes, formed on the active face (hereinafter, referred to as plane electrodes 68 so as to distinguish them from protrusion electrodes), are connected to the circuit substrate 53 by using wires 58, that is, more specifically, to plane electrodes (not shown) of a wiring layer 54 formed on the circuit substrate 53. The connection between electrodes using the wires 58 of this type is generally referred to as wire bonding.

Here, in the Figures, reference numeral 60 represents an external terminal that is connected to the wiring layer 54 through a penetration hole 61 formed in the circuit substrate 53. The surface of the circuit substrate 53 on the side having the installed semiconductor chip 50, etc. is covered with coat resin 59.

In a semiconductor device of the CSP structure as shown in FIG. 10(b), the semiconductor chip 50 is packaged on the circuit substrate 53 with its active face facing down (facedown bonding). Protrusion electrodes 56 are formed on plane electrodes (not shown) formed on the active face so that the protrusion electrodes 56 are directly connected to plane electrodes (not shown) on the wiring layer 54. The connection of this type directly connecting electrodes is generally referred to as flip-chip bonding.

Moreover, in some constructions to be packaged on a portable information apparatus, etc., in an attempt to give "added value" and to further increase the capacity, a plurality of semiconductor chips are included in one package so as to increase the packaging density. In this case, in a multi-chip module in which a plurality of chips are simply placed two-dimensionally, it is not possible to form a semiconductor package that is smaller than the total area of the semiconductor chips.

In this attempt, a technique for further increasing the packaging density by installing a plurality of semiconductor chips in a laminated manner has been proposed. FIGS. 11(a) and 11(b) show such semiconductor devices of the CSP structure having laminated semiconductor chips.

In the semiconductor device of the CSP structure shown in FIG. 11(a), the first semiconductor chip 51 and the second semiconductor ship 52 are installed on a circuit substrate 53 in a laminated manner, and these are respectively connected to the circuit substrate 53 by means of wire bonding by means of wires 58 (Prior Art (1)).

In the semiconductor device of the CSP structure shown in FIG. 11(b), of the first semiconductor chip 51 and the second semiconductor chip 52 laminated on the circuit substrate 53, the upper second semiconductor chip 52 is connected to the circuit substrate 53 by means of wire bonding, and the lower first semiconductor chip 51 is connected thereto by means of flip-chip bonding (see Japanese Laid-Open Patent Application No. 47998/1993 (Tokukaihei 5-47998) (published on Feb. 26, 1993) and Japanese Laid-Open Patent Application No. 326710/1995 (Tokukaihei 7-326710) (published on Dec. 12, 1995: Prior Art (2)).

Moreover, as illustrated in FIG. 12, Japanese Laid-Open Patent Application No. 84128/1988 (Tokukaishou 63-84128) (published on Apr. 14, 1988) discloses a semiconductor device in which a connection system combining the wire bonding and flip-flop chip bonding is adopted in the same manner as Prior Art (2) and in which the upper second semiconductor chip 52 is set to be larger than the lower first semiconductor chip 51, and these chips are packaged on a circuit substrate 53' such as a mother board (Prior Art (3)).

However, in these conventional structures, the size and combination of applicable semiconductor chips are limited, resulting in a problem of limited application.

Specifically, in Prior Art (1) shown in FIG. 11(a), in the case when the upper second semiconductor chip 52 is as large as, or larger than the lower first semiconductor chip 51, it is not possible to secure a space used for installing plane electrodes 68a on the active face of the first semiconductor chip 51. Therefore, it is not possible to use the second semiconductor chip 52 that is larger than the first semiconductor chip 51.

In the prior art (2) shown in FIG. 11(b), on the other hand, since the lower first semiconductor chip 51 is connected to the circuit substrate 53 by means of flip-chip bonding, the problem as explained in Prior Art (1) is not raised.

However, in Prior Art (2), the second conductor chip 52 is normally set to be smaller than, or as large as the first conductor chip 51. This is because when the upper second semiconductor chip 52 is made larger, it is not possible to carry out a stable wire bonding thereon. In other words, since no support exists below the plane electrodes 68 to which wires 58 of the second semiconductor chip 52 are connected, the second semiconductor chip 52 might be damaged due to an impact and a load at the time of wire bonding, or a sufficient load and ultrasonic waves might not be applied thereon.

Here, in Prior Art (3) shown in FIG. 12, although it has a construction in which the upper second semiconductor chip 52 is made larger, the plane electrodes 68 of the second semiconductor chip 52 are formed within the range of the lower first semiconductor chip 51 in a limited manner in order to stabilize the wire bonding.

This construction, which has the plane electrodes 68 placed apart from the edge of the second semiconductor chip 52, raises a problem in which elements on the periphery of the chip might be damaged or might contact the edge of the chip in a dicing process for dividing the wafer into semiconductor chips.

Therefore, it is not possible to adopt combinations in which either one of the chips is placed under the other with either of them sticking, such as a combination in which one of the chips virtually has a square shape with the other having a narrow rectangular shape.

Here, another technique is proposed in which a support member having the same thickness as the first semiconductor chip 51 is inserted to the lower portion of the second semiconductor chip 52 that is sticking out; however, this construction is not suitable because it is difficult to produce the support member having the same thickness with high precision and because complex processes cause high costs.

Moreover, even in the case when the upper second semiconductor chip 52 is smaller, if it is far smaller than the first semiconductor chip 51, these can not be combined. In other words, wires 58 become too long, causing wire flow and wire deformation. When an attempt is made to connect the wires 58 at positions on the wiring layer 54 as closely as possible to the first semiconductor chip 51, short-circuiting might occur due to contact with the edge of the first semiconductor chip 51. In order to avoid this problem, when the wires 58 are connected at positions far from the first semiconductor chip 51 on the wiring layer 54, the package size becomes larger.

SUMMARY OF THE INVENTION

The present invention relates to a semiconductor device for achieving a high density by laminating a plurality of semiconductor chips, and its objective is to provide a semiconductor device in which, even in the case when, from the semiconductor chips laminated on a circuit substrate, one portion of the semiconductor chip located on the other is protruding, wire bonding is preferably carried out by using an electrode placed at the protruding portion, and a manufacturing method for such a semiconductor device.

In order to achieve the above-mentioned objective, the manufacturing method of the semiconductor device of the present invention includes the steps of:

a) applying a bonding agent to a circuit substrate so as to connect a first semiconductor chip and the circuit substrate by means of flip-flop bonding through the bonding agent;

b) connecting a second semiconductor chip having a protruding portion protruding from the first semiconductor chip to the circuit substrate with a rear face thereof being bonded to a rear face of the first semiconductor chip by means of wire bonding at the protruding portion; and c) forming a support portion for supporting the protruding portion by using one portion of the bonding agent.

In the above-mentioned method, the first semiconductor chip is connected to the circuit substrate by means of flip-chip bonding through the bonding agent. The second semiconductor chip is connected to the circuit substrate by wire bonding.

In a conventional manufacturing method for a semiconductor device, in the case of the application of a connecting system using the above-mentioned combination of flip-chip bonding and wire bonding, there have been limitations imposed on the size and shape of the first and second semiconductor chips.

First, in the conventional system, when chips and a circuit substrate are connected by using the above-mentioned connecting method in the case where the second semiconductor chip protrudes from the first semiconductor chip, the following problems arise:

Upon carrying out wire bonding at the portion of the second semiconductor chip protruding from the first semiconductor chip, the second semiconductor chip might be damaged due to its impact and load; therefore, in the conventional manufacturing method of the semiconductor device, wire bonding is carried out at positions that are supported by the first semiconductor chip and located inside the protruding portion of the second semiconductor chip so as to prevent damages to the second semiconductor chip. However, such a conventional method lengthens wires to be used in the connection, causing problems of wire flow and wire deformation.

Second, in the conventional method, in the case when one of two chips is far smaller than the other, the smaller has been used as the second semiconductor chip; however, this case also has lengthened the wires, causing problems of wire flow and wire deformation, and failing to properly use such a combination of the chips.

In contrast, in the above-mentioned method of the present invention, one portion of the bonding agent used for the connection to the first semiconductor chip is utilized to form a support portion for supporting the protruding portion of the second semiconductor chip.

Consequently, since the protruding portion of the second semiconductor chip is supported by the support portion so that even the protruding portion is subjected to a wire bonding process stably without damages to the second semiconductor chip.

Moreover, even in the case when one of two chips is far smaller than the other, it is possible to use the smaller not as the second semiconductor chip, but rather as the first semiconductor chip; therefore, it becomes possible to avoid conventional problems of wire flow and wire deformation.

As described above, in the manufacturing method of the semiconductor device of the present invention, since no limitation is imposed on the size and shape of the first and second semiconductor chips, it is possible to apply combinations of chips having various sizes and shapes, such as a combination of a square chip and a rectangular chip, and consequently to widen the degree of freedom in designing.

Moreover, in the manufacturing method of the semiconductor device of the present invention, one portion of the bonding agent used for connecting the first semiconductor chip is utilized to form the support portion, without the need for separately installing a new member; thus, it becomes possible to prevent an increase in the number of processes as well as costs.

Furthermore, in order to achieve the above-mentioned objective, the semiconductor device of the present invention is provided with:

a first semiconductor chip that is connected to the circuit substrate through a bonding agent with an active face facing the circuit substrate;

a second semiconductor chip having a protruding portion protruding from the first semiconductor chip with the rear face thereof being bonded to the rear face of the first semiconductor chip, the protruding portion being connected to the circuit board by means of wire bonding; and a support portion for supporting the protruding portion, the support portion being formed by one portion of the bonding agent.

With the above-mentioned construction, the first and second semiconductor chips are joined to each other with their rear faces being bonded to each other, and respectively connected to the circuit substrate. The connection between the second semiconductor chip and the circuit substrate is made at the protruding portion protruding from the first semiconductor chip.

In other words, different from the conventional construction, the connection through the wires is not made on the portion of the second semiconductor chip supported by the first semiconductor chip; however, this wiring portion is supported by the support portion formed by one portion of the bonding agent so that it becomes possible to carry out a better wire bonding process without causing damages to the second semiconductor chip, and also to eliminate the necessity of carrying out wire bonding at the portion of the second semiconductor chip supported by the first semiconductor chip. Thus, it is possible to avoid the conventional problem of wire deformation.

For a fuller understanding of the nature and advantages of the invention, reference should be made to the ensuing detailed description taken in conjunction with the accompanying drawings.

DESCRIPTION OF THE EMBODIMENTS

Referring to FIGS. 1 through 5, the following description will discuss one embodiment of the present invention.

Figure 1:
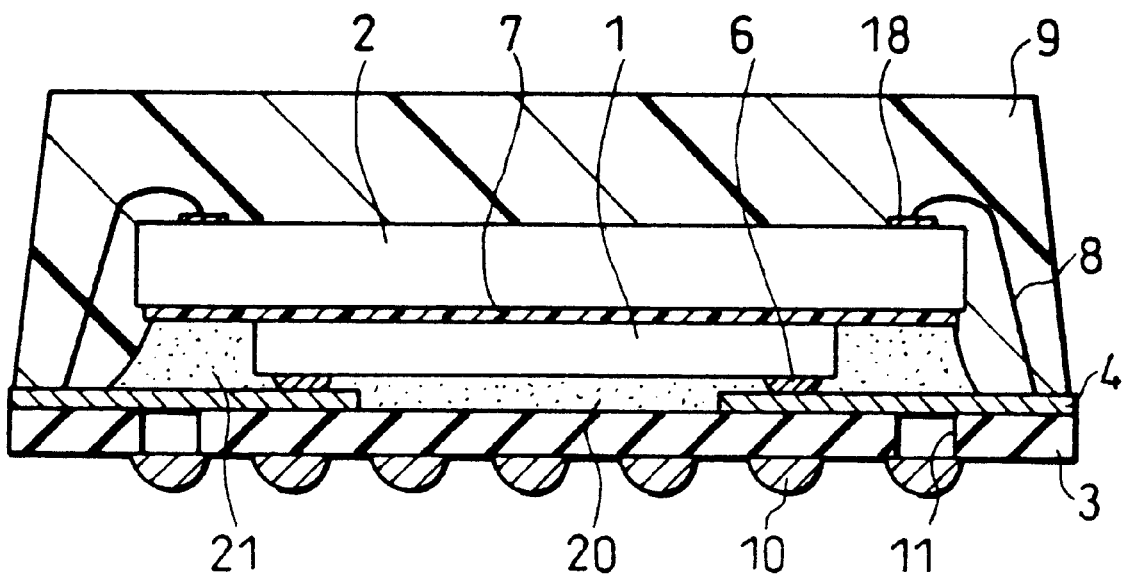
FIG. 1, which shows one embodiment of the present invention, is a cross-sectional view that shows a semiconductor device of a CSP structure.

As illustrated in FIG. 1, the semiconductor device of the present embodiment has a CSP structure (Chip Size Package) in which a first semiconductor chip 1 and a second semiconductor chip 2 are stacked on a circuit substrate 3, and these first semiconductor chip 1 and second semiconductor chip 2 are coated with a resin coat 9. Hereinafter, the surface of each of the first semiconductor chip 1 and the second semiconductor chip 2 on the side having elements (not shown) such as transistors is referred to as an "active face", and the surface on the side opposite to the active face is referred to as a "rear face" (as a "back face" in claims).

A wiring layer 4 is formed on the circuit substrate 3 on one surface on the side where the first semiconductor chip 1 is installed, and packaging-use external terminals 10 are formed on the surface on the opposite side. The packaging-use external terminals 10 and the wiring layer 4 are electrically connected to each other through penetration holes 11 formed in the circuit substrate 3.

The first semiconductor chip 1 is installed with its active face up on the circuit substrate side 3. Protrusion electrodes 6 are formed on a plane electrode (not shown) formed on the active face, and these protrusion electrodes 6 and a plane electrode (not shown) of the wiring layer 4 of the circuit substrate 3 are connected with each other. In other words, the first semiconductor chip 1 is connected to the circuit substrate 3 by means of flip-chip bonding.

The second semiconductor chip 2 is greater than the first semiconductor chip 1 both in length and width, and is installed with its active face facing the side opposite to the circuit substrate 3 side. The rear face of the second semiconductor chip 2 is bonded to the rear face of the first semiconductor chip 1 with an insulating bonding agent 7. Plane electrode 18 of the active face are formed on protruding portions in a state where the first semiconductor chip 1 and the second semiconductor chip 2 are laminated so that the plane electrode (not shown) of the wiring layer 4 of the circuit substrate 3 and the plane electrodes 18 are connected to each other by wires 8. In other words, the second semiconductor chip 2 is connected to the circuit substrate 3 by means of wire-bonding.

Figure 12:
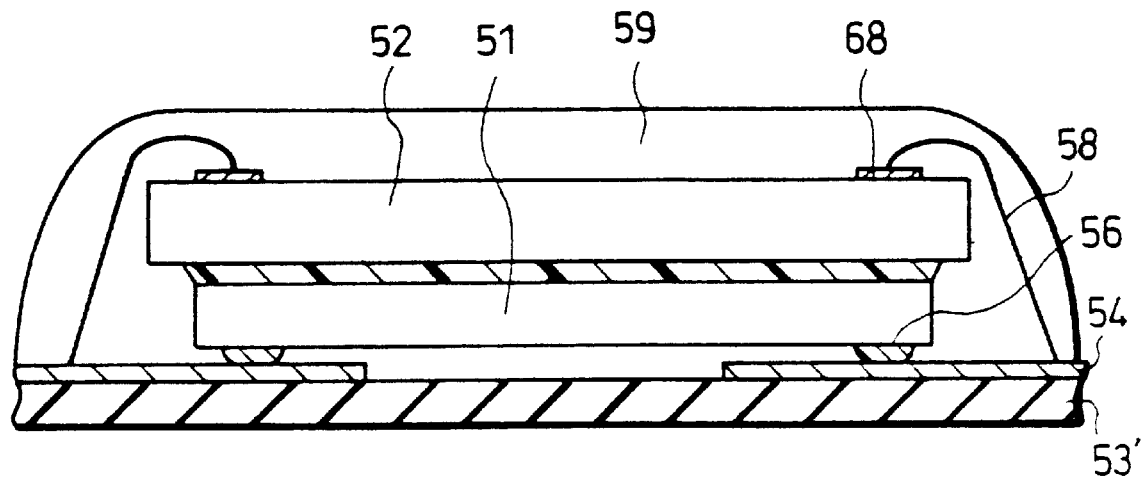
FIG. 12 is a cross-sectional view that shows still another conventional semiconductor device.

Here, different from the conventional semiconductor device shown in FIG. 12, the plane electrodes 18 are formed on the protruding portions (protrusions) of the second semiconductor chip 2 supported by support portions 21 from under. Therefore, even in the case when the plane electrodes 18 are formed on the protruding portions, since the protruding portions are supported by the support portions 21 so that the second semiconductor chip 2 is free from damages caused by an impact and a load; thus, it is possible to carry out a stable wire bonding process by applying a sufficient load and ultrasonic waves.

As will be described later, these support portions 21 are formed by one portion of a film-shaped anisotropic conductive bonding agent 20 that has been used upon flip-chip bonding the first semiconductor chip 1 to the circuit substrate 3 and that has been hardened.

Next, referring to FIGS. 2(a) to 2(f) through FIGS. 4(a) and 4(b), an explanation will be given of a manufacturing process of a semiconductor device having the above-mentioned structure. FIGS. 2(a) through 2(f) are cross-sectional views that show processes through which a plurality of the semiconductor devices are produced; and, for example, these Figures exemplify a case for manufacturing four semiconductor devices of the CSP structure in one lot.

Figure 2A:
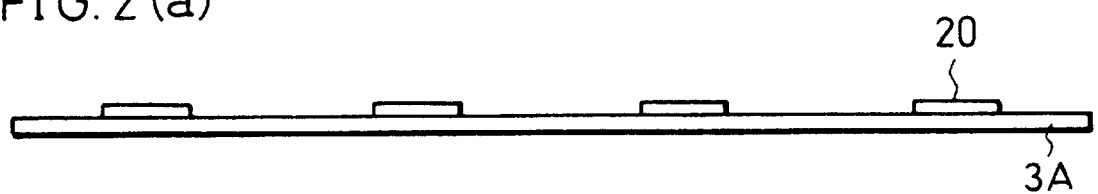
FIGS. 2(a) through 2(f) are cross-sectional views that show manufacturing processes of the semiconductor device shown in FIG. 1.

First, as illustrated in FIG. 2(a), a film-shaped anisotropic conductive bonding agent 20 is affixed to a circuit substrate 3A so as to be temporarily press-bonded. Not specifically indicated in the Figure, four of the aforementioned wiring layers 4 are formed on the circuit substrate 3A, and in a manner so as to cover the respective wiring layers 4, the anisotropic conductive bonding agent 20 is temporarily press-bonded. The temporary press-bonding process is carried out, for example, under a heating condition of 100° C. for 10 seconds, under a pressure of 10 kgf/cm$^2$.

The anisotropic conductive bonding agent 20 is preferably made from a thermo-setting resin for reasons as will be described later; and, for example, this is prepared as a film-shaped bonding resin formed by dispersing and mixing conductive particles, such as metal particles of Au and Ni and particles obtained by plating metal on resin, in a thermo-setting binder made of epoxy as its base.

Here, besides such an anisotropic conductive bonding agent 20, an insulating bonding agent may be adopted as long as it is a bonding agent that provides sufficient reliability in the joining process between the protrusion electrodes 6 and the plane electrode of the circuit substrate 3A. With respect to the insulating bonding agent, for example, bonding agents of a type which provides conduction between the protrusion electrodes 6 and the plane electrode of the circuit substrate 3A, for example, by utilizing only a bonding strength and a contracting force of the resin. Here, a bonding sheet 23 (see FIGS. 8(a) and 8(b)), which is used in Embodiment 3 as will be described later, forms one example of the bonding agent of this type.

Figure 2B:
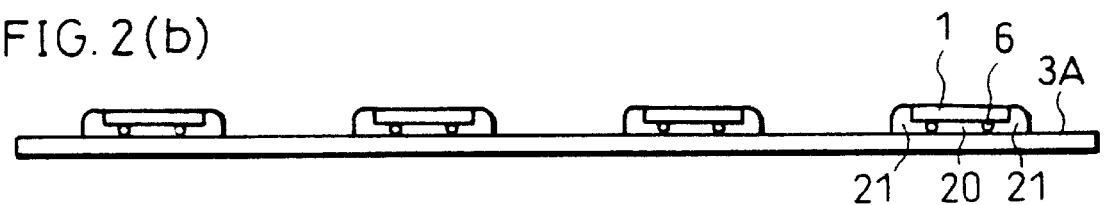

Next, as illustrated in FIG. 2(b), the first semiconductor chip 1 is installed on the anisotropic conductive bonding agent 20. The first semiconductor chip 1 is installed with its active face facing the circuit substrate 3A, and connected to the circuit substrate 3A through the protrusion electrodes 6. At this time, the anisotropic conductive bonding agent 20 is extruded from the first semiconductor chip 1 so as to protrude so that the support portions 21, formed by the protruding resin, are made to have the same level as the rear face of the first semiconductor chip 1.

Figure 2C:
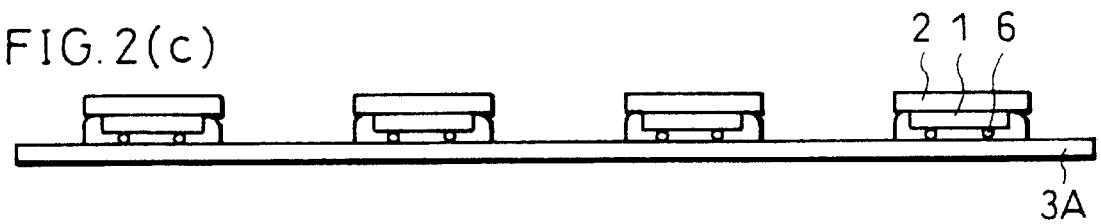

Next, as illustrated in FIG. 2(c), the second semiconductor chip 2 is installed on the first semiconductor chip 1 and the support portions 21 with its active face facing up.

Figure 2D:
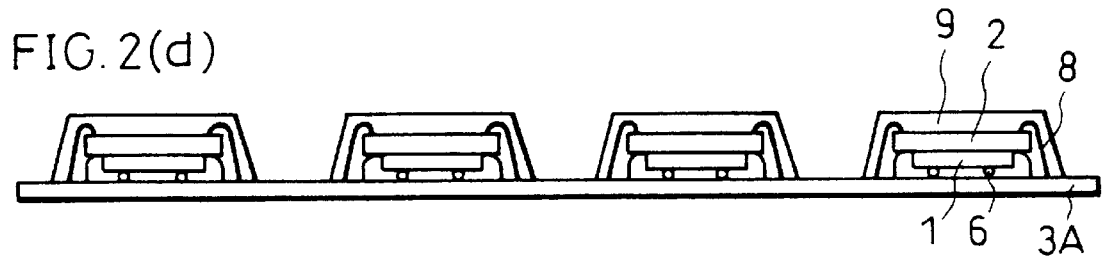

Thereafter, as illustrated in FIG. 2(d), the second semiconductor chip 2 and the circuit substrate 3A are connected through wires 8, and the first conductor chip 1, the second conductor chip 2, the wires 8 and the circuit substrate 3A are coated with a resin coat 9. Thus, the installing process of the first semiconductor chip 1 and the second semiconductor chip 2 is complete.

Figure 2E:
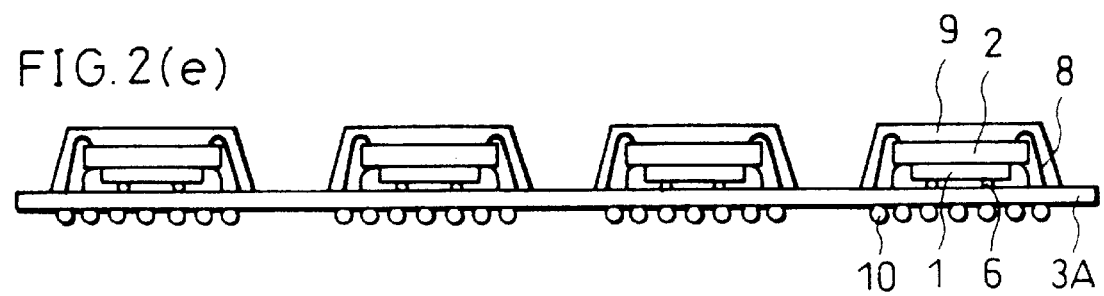
Figure 2F:
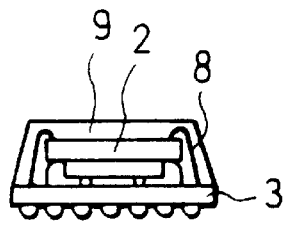

Thereafter, as illustrated in FIG. 2(e), a solder ball is formed on the portion of the penetration hole 11 (see FIG. 1) of the circuit substrate 3A as a packaging-use external terminal 10, and by cutting unnecessary portions of the circuit substrate 3A off, a semiconductor device of the CSP structure as a single part is completed as illustrated in FIG. 2(f).

Referring to FIGS. 3(a) through 3(c) and FIGS. 4(a) and 4(b), among the above-mentioned processes, a detailed explanation will be further given of the process for connecting the first semiconductor chip 1 and the second semiconductor chip 2 to the circuit substrate 3A.

Figure 3A:
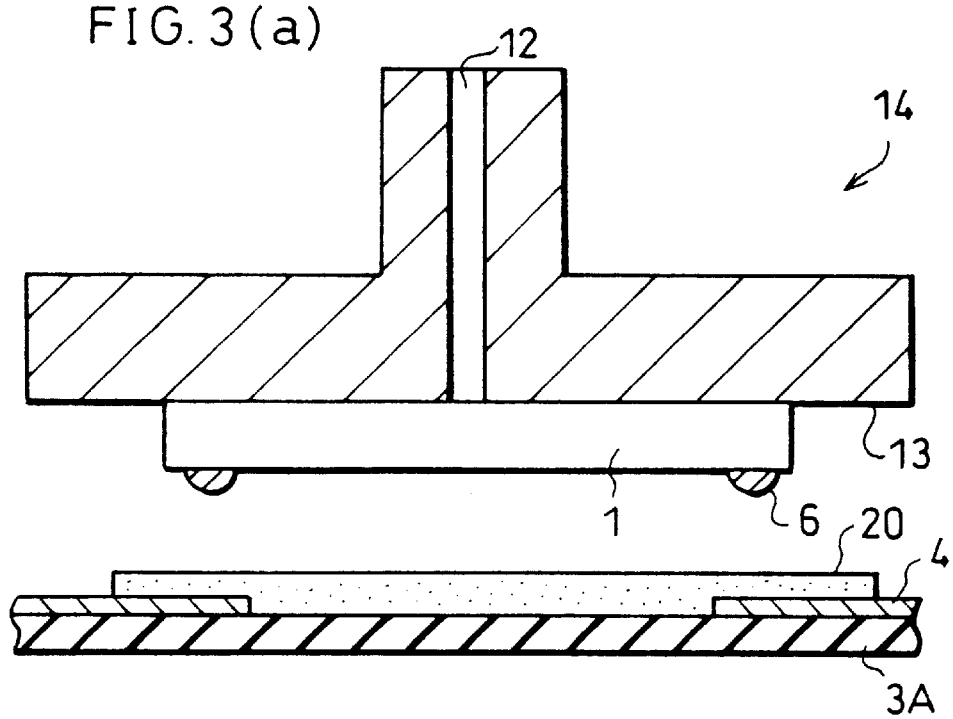
FIGS. 3(a) through 3(c) are cross-sectional views that show bonding processes in which a first semiconductor chip is bonded to a circuit substrate.

First, as illustrated in FIG. 3(a), the first semiconductor chip 1 and the circuit substrate 3A are aligned face to face with each other by using a bonding tool (suction support member) 14. The bonding tool 14 is provided with a suction nozzle 12 and a suction face 13 so that the first semiconductor chip 1 is sucked onto the suction face 13 from the rear face side thereof so that it is allowed to face the circuit substrate 3A. At this time, positioning is made between the protrusion electrodes 6 of the first semiconductor chip 1 and the plane electrode (not shown) formed on the wiring layer 4.

Figure 3B:
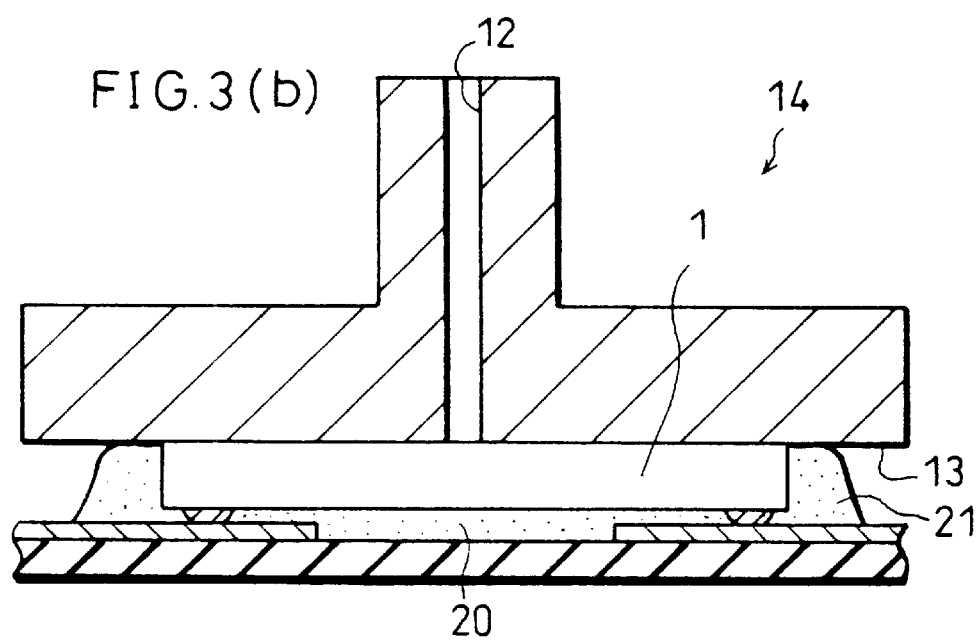

Next, as illustrated in FIG. 3(b), the protrusion electrodes 6 and the plane electrode (not shown) are made in contact with each other while pressure and heat are being applied through the bonding tool 14. The anisotropic conductive bonding agent 20 is allowed to soften due to the application of heat so that one portion thereof is extruded out of the first semiconductor chip 1 in a protruding manner. The support portions 21, which are made of protruding resin, are allowed to swell, and soon come into contact with the suction face 13 of the bonding tool 14. In this manner, the height of the support portions 21 are kept in the same level as the rear face of the first semiconductor chip 1, by utilizing the suction face 13 of the bonding tool 14.

Moreover, as the gap between the first semiconductor chip 1 and the circuit substrate 3A is narrowed, setting of the anisotropic conductive bonding agent 20 and the support portions 21 is allowed to progress. Thus, the conductive particles in the anisotropic conductive bonding agent 20 are sandwiched between the protrusion electrodes 6 and the plane electrode of the circuit substrate 3A so that conduction is made between the protrusion electrodes 6 and the plane electrode.

With respect to the anisotropic conductive bonding agent 20, for example, anisotropic conductive bonding agent MJ932, manufactured by Sony Chemical K.K., may be used, and this product softens at approximately 130° C. with appropriate fluidity.

For example, supposing that the size of the first semiconductor chip 1 is 8.4×6.3 mm$^2$ with a thickness of 0.2 mm, that the size of the second semiconductor chip 2 is 10.4×8.3 mm$^2$, and that the height of bumps after connection (the distance between the active face of the first conductor chip 1 and the wiring layer 4) is 0.025 mm, calculations were made with irregularities on the circuit substrate 3A side being ignored and considered to be flat; consequently, it was found that a film-shaped anisotropic conductive bonding agent 20 having a size of approximately 9×7 mm$^2$ with a thickness of 0.15 mm needs to be used.

Figure 3C:
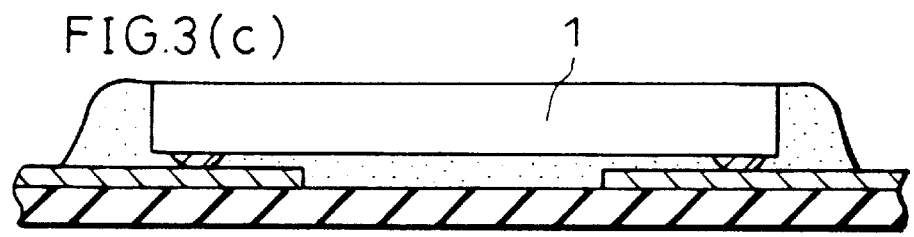

After the support portions 21 have been sufficiently set by applying predetermined heat and pressure, the bonding tool 14 is cooled, and the bonding tool 14 is then separated from the first semiconductor chip 1 (see FIG. 3(c)).

It is confirmed that, supposing that the number of the protrusion electrodes 6 formed on the first semiconductor chip 1 is forty and that the size of the first semiconductor chip 1 is 8.4×6.3 mm$^2$, the pressure is preferably set to 10 kgf/chip and the heating condition is set to approximately 200° C. for 30 seconds.

In this case, when a coat film of a fluororesin is preliminarily formed on the suction face 13 of the bonding tool 14, it becomes possible to easily remove the bonding tool 14 from the support portions 21. With respect to the coat film of a fluororesin, for example, a Protonic System made by Nippon Proton (K.K.) may be used.

Next, as illustrated in FIG. 4(a), the second semiconductor chip 2 is bonded to the rear face of the first semiconductor chip 1. Bonding agent 7 is preliminarily applied to the rear face of the semiconductor chip 2 so that the semiconductor chip 2 is secured onto the first semiconductor chip 1 by this bonding agent 7.

With respect to the bonding agent 7, in the case when electric potentials of the support substrate of the first semiconductor chip 1 and the support substrate of the second semiconductor chip 2 are the same, a conductive bonding agent is used, and in the case when the electric potentials are different from each other, an insulating bonding agent is used. Not particularly limited, those of a film shape, a paste shape and a liquid state may be adopted as the bonding agent 7.

Figure 4:
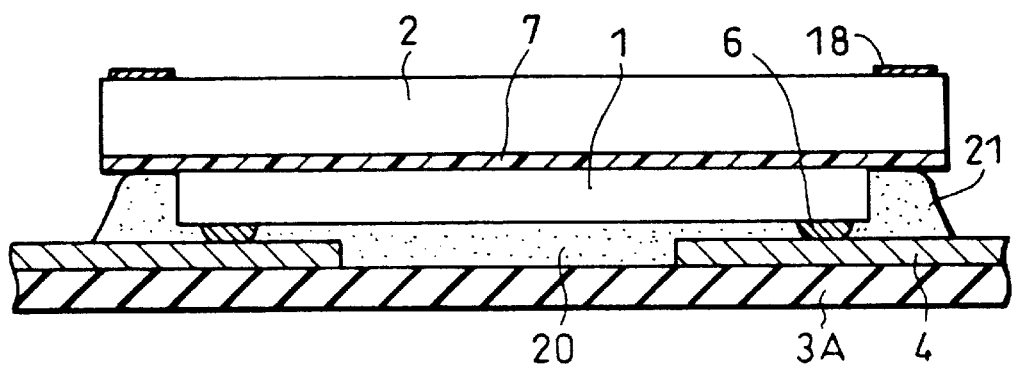
FIG. 4(a) is a cross-sectional view that shows a state in which a second semiconductor chip is installed.
FIG. 4(b) is a cross-sectional view that shows a state in which the second semiconductor chip is wire-bonded to the circuit substrate.
Figure 4:
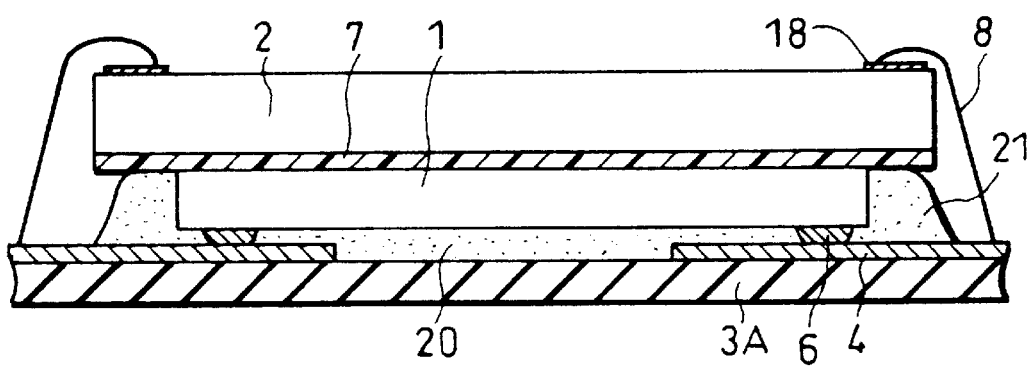

Thereafter, as illustrated in FIG. 4 (b), the plane electrode 18 of the second semiconductor chip 2 and the circuit substrate 3A are connected to each other with wires 8. At this time, since the plane electrode 18 is supported by the support portions 21, a sufficient load and ultrasonic waves can be applied without causing damages to the second semiconductor chip 2 even upon carrying out the wire bonding process. Moreover, in this case, when a bonding resin having a thermo-setting property is used as the anisotropic conductive bonding agent 20, it becomes possible to stably support the second semiconductor chip 2 without allowing the resin to soften even upon application of heat and ultrasonic waves.

Figure 5:
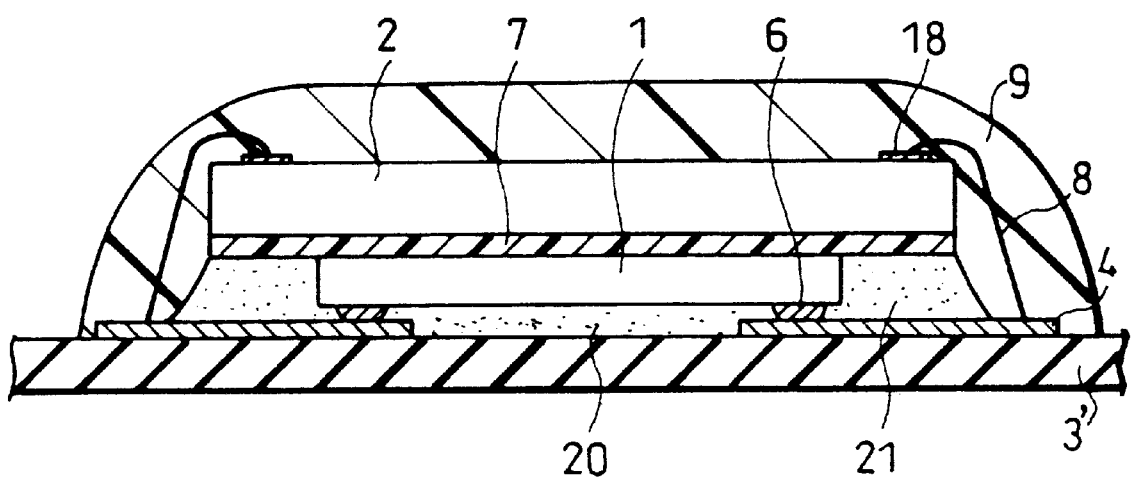
FIG. 5, which shows another embodiment of the present invention, is a cross-sectional view that shows a semiconductor device of a packaging type.

Here, in the present embodiment, an explanation has been given by exemplifying a semiconductor device of the CSP structure; however, as illustrated in FIG. 5, the above-mentioned arrangement may be applied to a packaged-type semiconductor device in which the first semiconductor chip 1 and the second semiconductor chip 2 are packaged on a circuit substrate 3' such as a mother board.

In other words, in the same manner as the arrangement shown in FIG. 1, the first semiconductor chip 1 and the second semiconductor chip 2 are laminated on the circuit substrate 3' and this is coated with a resin coat 9. The first semiconductor chip 1 and the second semiconductor chip 2 are connected to the circuit substrate 3' respectively by means of flip-chip bonding and wire bonding. Protruding portions of the second semiconductor chip 2 on which the plane electrode 18 has been formed are supported from below by support portions 21 formed by protruding resin of an anisotropic conductive bonding agent 20. Therefore, even upon carrying out the wire bonding process on the plane electrode 18, a sufficient load and ultrasonic waves can be applied without causing damages to the second semiconductor chip 2 from the impact and load.

As described above, in the present embodiment, upon flip-chip bonding the first semiconductor chip 1 on the circuit substrate 3, the anisotropic conductive bonding agent 20 is used, and one portion thereof is allowed to protrude between the first semiconductor chip 1 and the circuit substrate 3. The height of this protruding bonding agent is adjusted to the same level as the rear face of the first semiconductor chip 1 so as to form a support portion 21 that is used upon wire-bonding the plane electrode 18 formed on each of the protruding portions of the second semiconductor chip 2.

In other words, the present invention relates to a semiconductor device which has a first semiconductor chip 1 that has been flip-chip connected onto a circuit substrate 3 through an anisotropic conductive bonding agent 20 and a second semiconductor chip 2 that is affixed on a rear face of the first semiconductor chip 1 and wire-bonded, wherein each of the protruding portions of the second semiconductor chip 2 from the outer edges of the first semiconductor chip 1 is supported by the bonding agent protruding from the first semiconductor chip 1.

More specifically, simultaneously as the first semiconductor chip 1 having protrusion electrodes 6 formed thereon is flip-chip connected onto the circuit substrate 3 through the anisotropic conductive bonding agent 20, one portion of the anisotropic conductive bonding agent 20 is allowed to protrude between the first semiconductor chip 1 and the circuit substrate 3, with the height of the support portion 21 thus formed being adjusted to the same level as the rear face of the first semiconductor chip 1; thereafter, the following steps are carried out: setting the anisotropic conductive bonding agent 20, affixing the second semiconductor chip 2 on the rear face of the first semiconductor chip 1 and the resulting support portion 21; and connecting the plane electrode 18 of the second semiconductor chip 2 and the plane electrode of the circuit substrate 3 are connected by means of wire bonding.

With this arrangement, even when the second semiconductor chip 2, located above, protrudes from the first semiconductor chip 1 located below, wire bonding is carried out on the plane electrode 18 formed on the protruding portion in a stable manner.

Not to mention the combination of semiconductor chips with one located above being greater than the other located below, any combination, such as a combination of a square and a rectangle that inevitably causes one to protrude from the other and a combination of an extremely small one and the other one, may be adopted without being influenced by the combination of shapes and sizes of semiconductor chips to be laminated; therefore, it is possible to obtain a semiconductor device having a high packaging density.

[Embodiment 2]

Referring to FIGS. 6(a) and 6(b) and FIGS. 7(a) and 7(b), the following description will discuss another embodiment of the present invention. For convenience of explanation, those of the members described in Embodiment 1 are indicated by the same reference numerals and the description thereof is omitted.

The semiconductor device described in this embodiment has the same arrangement as the semiconductor device of the CSP structure described in Embodiment 1 shown in FIG. 1.

The following description will explain the manufacturing method thereof.

In Embodiment 1, after the first semiconductor chip 1 has been installed on the circuit substrate 3 and bonded thereto, the second semiconductor chip 2 is installed on the first semiconductor chip 1 and bonded thereto; however, in this embodiment, the second semiconductor chip 2 and the first semiconductor chip 1 are preliminarily bonded to each other, and the first semiconductor chip 1 and the second semiconductor chip thus bonded are then installed on the circuit substrate 3 and bonded thereto.

Figure 6A:
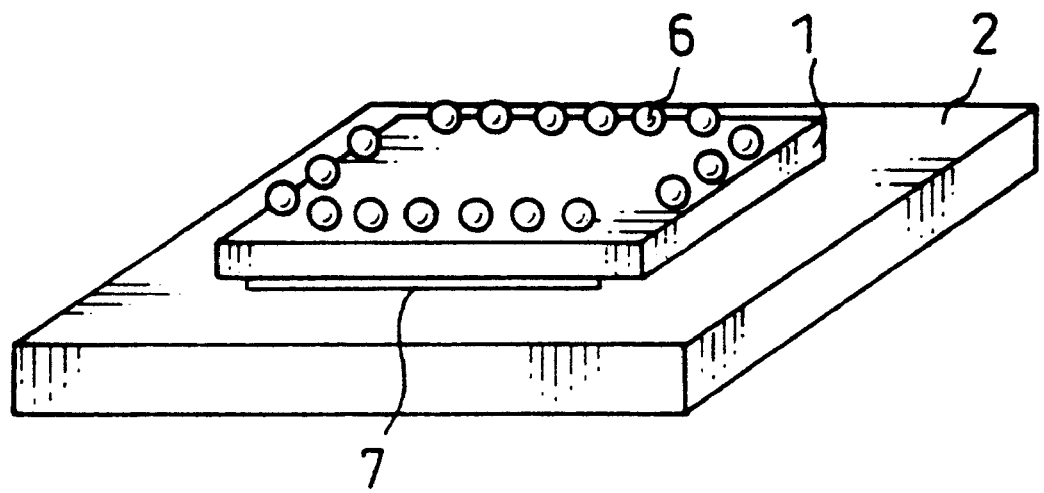
FIGS. 6(a) and 6(b), which show other embodiments of the present invention, are perspective views, each showing an example of bonding between the first semiconductor chip and the second semiconductor chip.
Figure 6B:
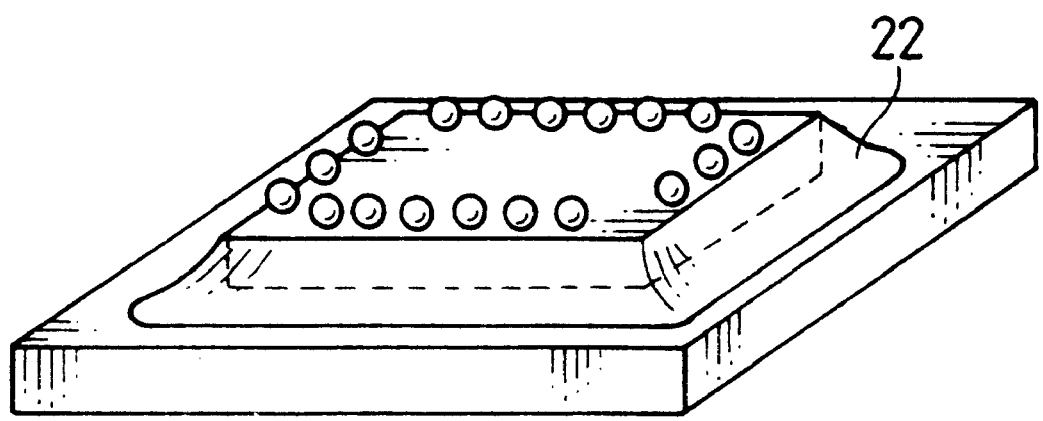

In other words, as illustrated in FIGS. 6(a) and 6(b), the first semiconductor chip 1 and the second semiconductor chip 2 are bonded with a bonding agent 7.

FIG. 6(a) shows a case in which a film-shaped bonding agent 7 is used, and FIG. 6(b) shows a case in which a bonding agent, which has a paste form or a liquid form, or is allowed to flow upon application of heat, is used.

As illustrated in FIG. 6(a), in the case of the film-shaped bonding agent 7, the film-shaped bonding agent 7 is affixed onto the first semiconductor chip 1 in its wafer state from the rear face of the wafer by means of thermal press-bonding. Thereafter, this is cut into the first semiconductor chip 1 so that the bonding agent 7 is affixed onto the rear face of the first semiconductor chip 1 without offsets. Further, the rear face (the face on the upper side in FIG. 6(a)) of the second semiconductor chip 2 is pressed onto the bonding agent 7, and bonded thereto by applying predetermined load and heat.

Moreover, as illustrated in FIG. 6 (b), in the case when a bonding agent, which has a paste form or a liquid form, or is allowed to flow upon application of heat, is used, after the bonding agent 7 in an appropriate amount has been applied onto the rear face of the second semiconductor chip 2 (the face on the upper side in FIG. 6(b)) by using a dispenser, etc., the rear face of the first semiconductor chip 1 is pressed thereon. Then, the bonding agent 7 is heated and set under a predetermined heating condition. At this time, in the case of the bonding agent 7 which has a paste form or a liquid form, or is allowed to flow upon application of heat, a fillet 22 is formed on the peripheral edges of the first semiconductor chip 1.

Figure 7A:
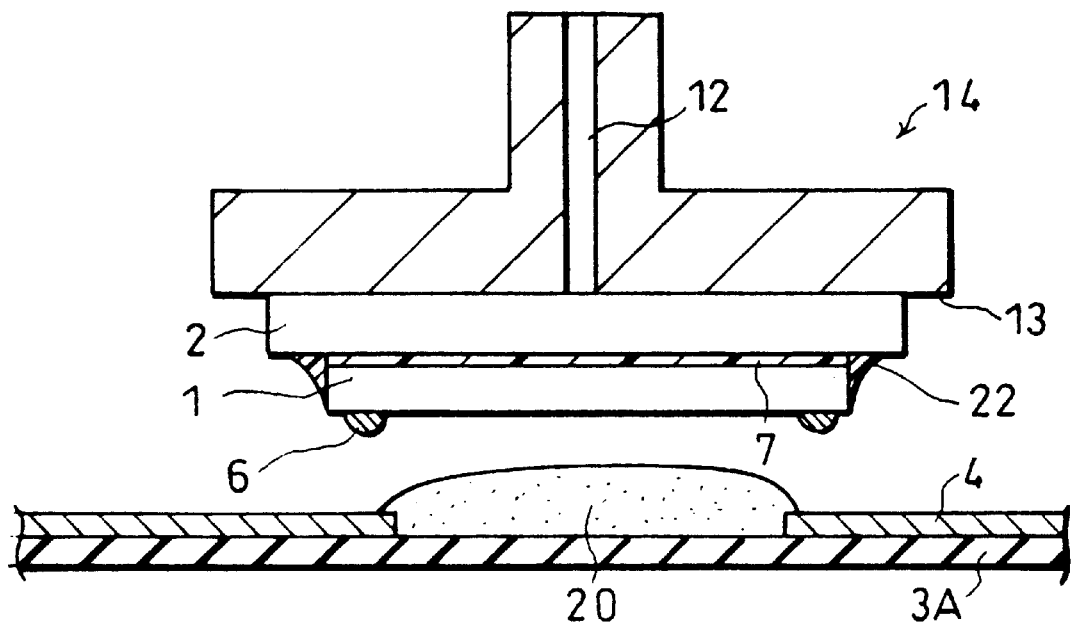
FIGS. 7(a) and 7(b) are cross-sectional views that show processes in which the bonded first and second semiconductor chips are installed on the circuit substrate.

The first semiconductor chip 1 and the second semiconductor chip 2, bonded to each other in this manner, are aligned face to face with the circuit substrate 3A as illustrated in FIG. 7(a). This Figure shows the case in which the fillet 22 has been preliminarily formed on the peripheral edges of the first semiconductor chip 1.

Figure 7B:
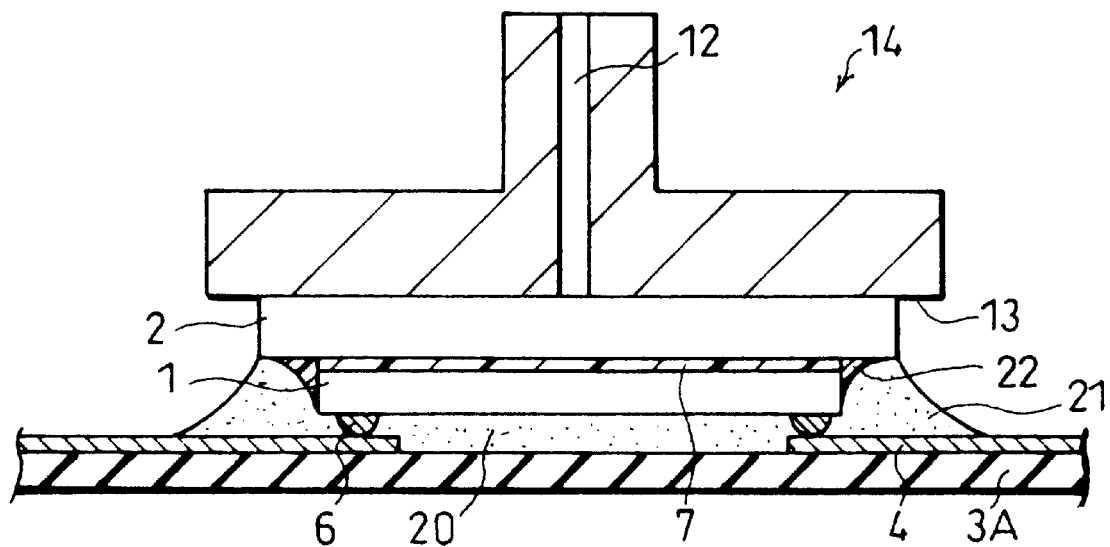

Next, as illustrated in FIG. 7(b), a bonding tool 14 is lowered so as to allow protrusion electrodes 6 formed on the first semiconductor chip 1 and the plane electrode of the circuit substrate 3A to contact each other. Moreover, a load is further applied to this, and as the distance between the first semiconductor chip 1 and the circuit substrate 3A is gradually narrowed, the anisotropic conductive bonding agent 20 is allowed to spread over the entire active face of the first semiconductor chip 1, and excessive anisotropic conductive bonding agent 20 is soon allowed to protrude outside the first semiconductor chip 1. A support portion 21, formed by the protruding resin, swells along the peripheral edges of the first semiconductor chip 1, and is allowed to contact the rear face of the second semiconductor chip 2.

Processes taken thereafter are the same as those in the manufacturing processes of the semiconductor device of Embodiment 1, and upon wire-bonding the second semiconductor chip 2, the set matter of the resin protrusion is utilized as the support portion 21 so that a sufficient load and ultrasonic waves can be applied without damaging the second semiconductor chip 2.

In this manner, in the present embodiment, before the first semiconductor chip 1 has been flip-chip bonded to the circuit substrate 3, the first semiconductor chip 1 and the second semiconductor chip 2 are bonded to each other, and the height of the protruding bonding agent to form the support portion 21 is adjusted to the same level as the rear face of the first semiconductor chip 1 by the protruding portion of the second semiconductor chip 2.

In other words, there are steps of: bonding the rear face of the first semiconductor chip 1 having the protrusion electrodes 6 formed thereon and the rear face of the second semiconductor chip 2 having at least one pair of sides that are larger than the first semiconductor chip 1 to each other; flip-chip connecting the active face of the first semiconductor chip 1 and the circuit substrate 3 that have been aligned face to face with each other by using the anisotropic conductive bonding agent 20, as well as simultaneously allowing one portion of the anisotropic conductive bonding agent 20 to protrude between the first semiconductor chip 1 and the circuit substrate 3 so as to form a support portion 21 for the portion of the second semiconductor chip 2 that sticks out from the outer edge of the first semiconductor chip 1; and connecting the plane electrode 18 of the second semiconductor chip 2 and the plane electrode of the circuit substrate 3 by means of wire bonding.

Therefore, since the support portion 21 is blocked by the second semiconductor chip 2, it does not contact the suction face 13 of the bonding tool 14. This eliminates the necessity of any process for improving the separating property of the suction face 13 from the support section 21, such as forming a coat film made of fluororesin on the suction face 13, which has been required in the manufacturing method explained in Embodiment 1; therefore, it becomes possible to prevent an increase in manufacturing costs.

Moreover, in particular, as illustrated in FIG. 7(b), in the case when the fillet 22 is preliminarily formed on the peripheral edges of the first semiconductor chip 1, it is possible to make the flow of the anisotropic conductive bonding agent 20 smoother upon bonding the first semiconductor chip 1 to the circuit substrate 3A. The resulting effects are prevention of bubble inclusion, a reduction in the occurrence of voids and a subsequent improvement in the yield.

[Embodiment 3]

Referring to FIGS. 8(a) and 8(b) and FIGS. 9(a) and 9(b), the following description will discuss still another embodiment of the present invention. For convenience of explanation, those of the members described in Embodiments 1 and 2 are indicated by the same reference numerals and the description thereof is omitted.

The semiconductor device described in this embodiment has virtually the same arrangement as the semiconductor device of the packaging type explained in Embodiment 1 by reference to FIG. 5. Here, in the above-mentioned case of the first semiconductor chip 1 and the circuit substrate 3', both of the electrical connection at the time of flip-chip bonding and the mechanical connection between the first semiconductor chip 1 and the circuit substrate 3' are made by using only the anisotropic conductive bonding agent 20 used as a bonding agent; however, the present embodiment is distinct therefrom in that the electrical connection is made by using only solder 16 and the mechanical connection is made by using the solder 16 and a bonding sheet 23.

The manufacturing method is almost the same as that of Embodiment 2, except that the solder 16 is supplied onto the plane electrode of the circuit substrate 3' on which is further supplied the bonding sheet 23.

The following description will discuss the manufacturing method of the present embodiment.

Figure 8A:
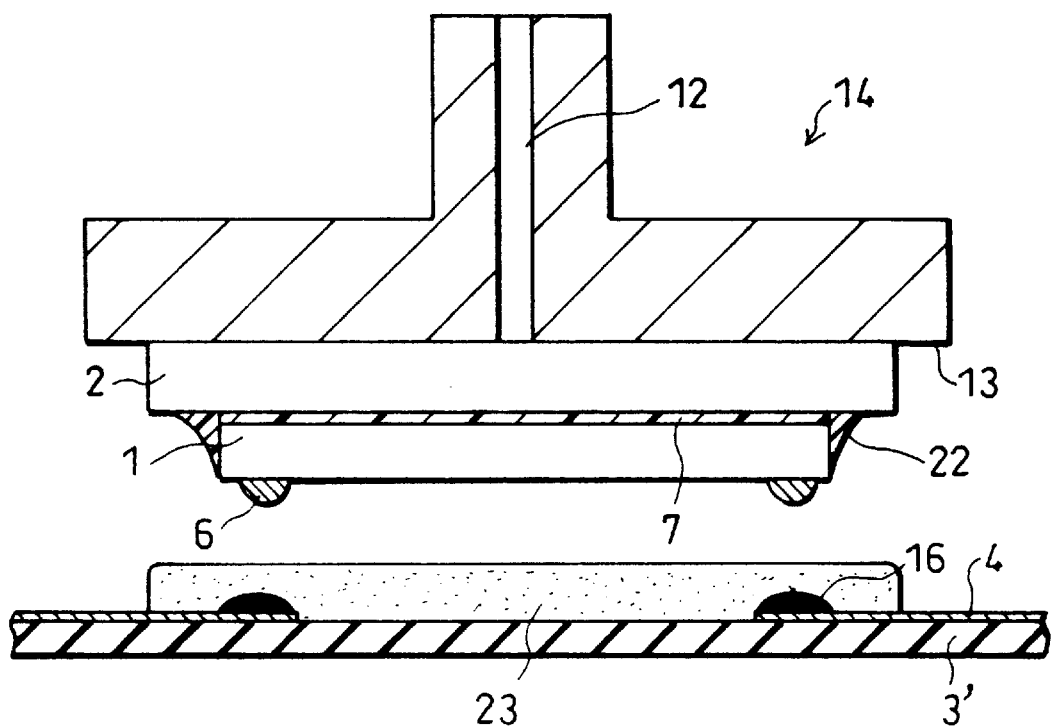
FIGS. 8(a) and 8(b), which both show still another embodiment of the present invention, are cross-sectional views that show a manufacturing method of a semiconductor device of a packaging type.

As illustrated in FIG. 8(a), prior to bonding the first semiconductor chip 1 onto the circuit substrate 3', the solder 16 and the bonding sheet 23 are preliminarily supplied onto the circuit substrate 3'. More specifically, a plane electrode (not shown) is placed on a wiring layer 4 of the circuit substrate 3' such as a mother board, and solder 16 containing Ag and Sn as its main components is supplied onto the plane electrode. Moreover, a bonding sheet 23, made of a thermosetting resin, is supplied onto the circuit substrate 3' so as to cover the plane electrode.

With respect to the bonding sheet 23, it is preferable to use a material, such as a thermo-setting bonding resin containing epoxy as its main component, that is allowed to soften to exhibit a fluidity in the range of approximately 100° C. to 150° C., but is set upon application of heat exceeding approximately 200° C. For example, PFM2100 made by Nitto Denko (K.K.), etc. may be adopted.

Figure 8B:
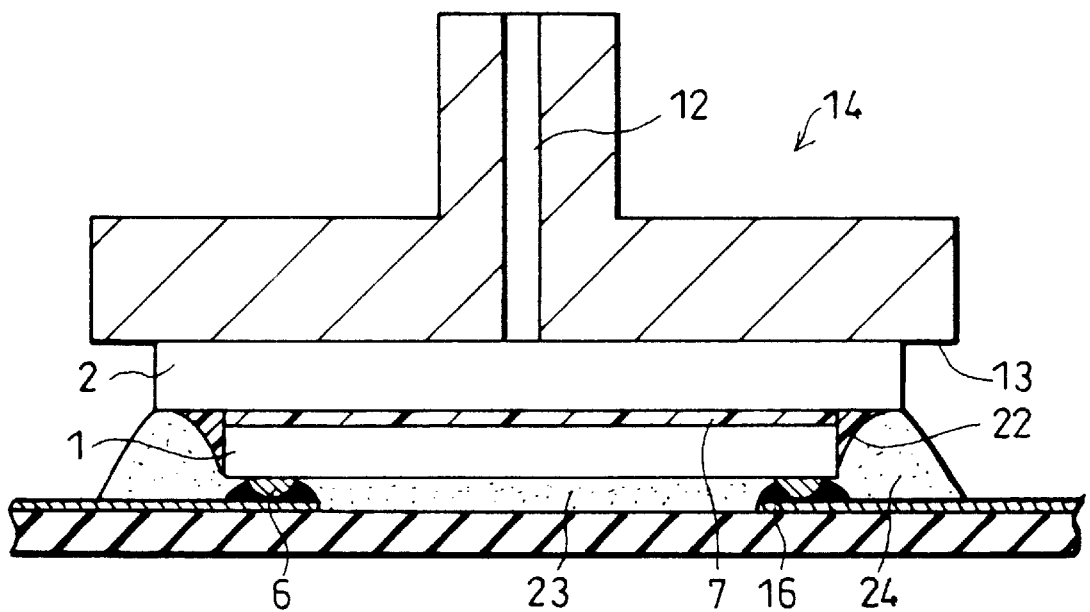

Next, as illustrated in FIG. 8(b), a bonding tool 14 is used to apply a pressure so as to make the protrusion electrodes 6 and the plane electrode of the circuit substrate 3' contact with each other. Successively, heat is applied so that the bonding sheet 23 is allowed to flow while the solder 16 is fused, thereby allowing the protrusion electrodes 6 made of Au to join to the solder 16. After the bonding sheet 23 has been set by applying a pressure and heat for a predetermined time, the bonding tool 14 is cooled off so that the solder joining between the protrusion electrodes 6 and the solder 16 is complete.

At this time, a support portion 24, formed by the flowing and protruding resin, swells along the peripheral edges of the first semiconductor chip 1, and is allowed to contact the rear face of the second semiconductor chip 2.

Figure 9A:
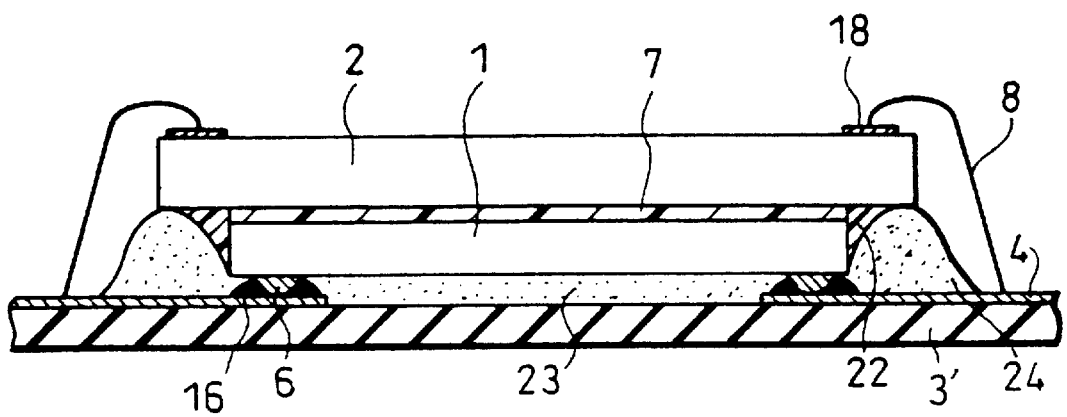
FIGS. 9(a) and 9(b), are cross-sectional views that show processes taken after the processes of FIG. 8(b).

Next, as illustrated in FIG. 9(a), the plane electrode 18 of the second semiconductor chip 2 and the plane electrode of the circuit substrate 3' are connected to each other by wires 8.

Figure 9B:
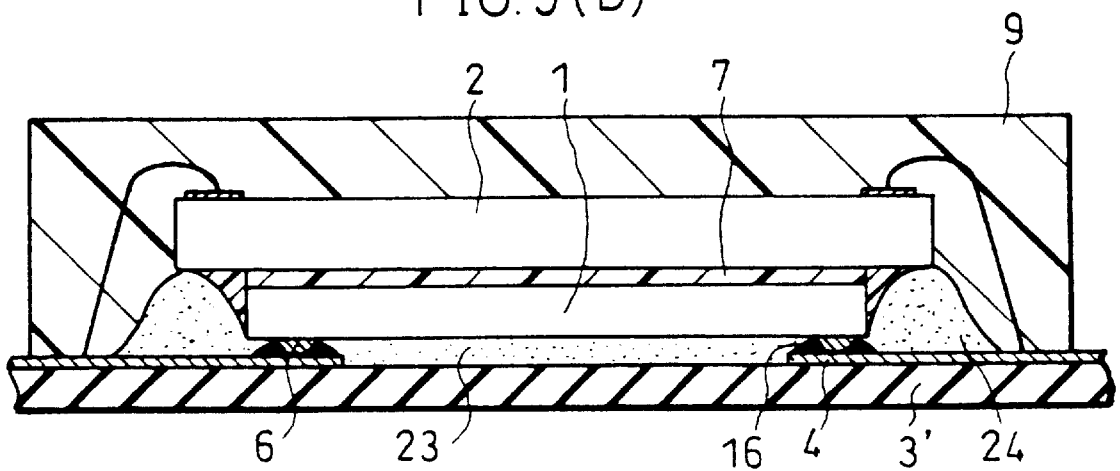
Figure 10A:
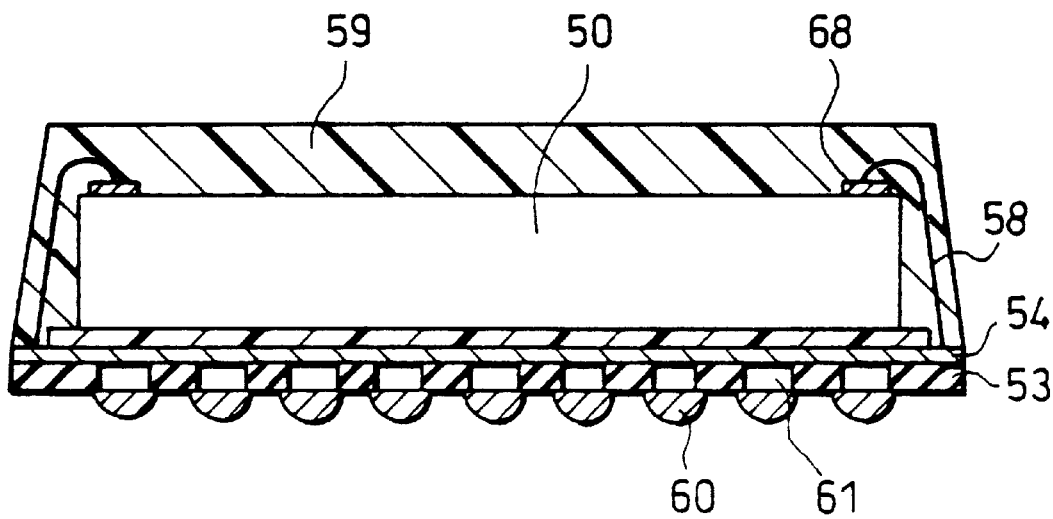
FIGS. 10(a) and 10(b) are cross-sectional views that show a conventional semiconductor device.
Figure 10B:
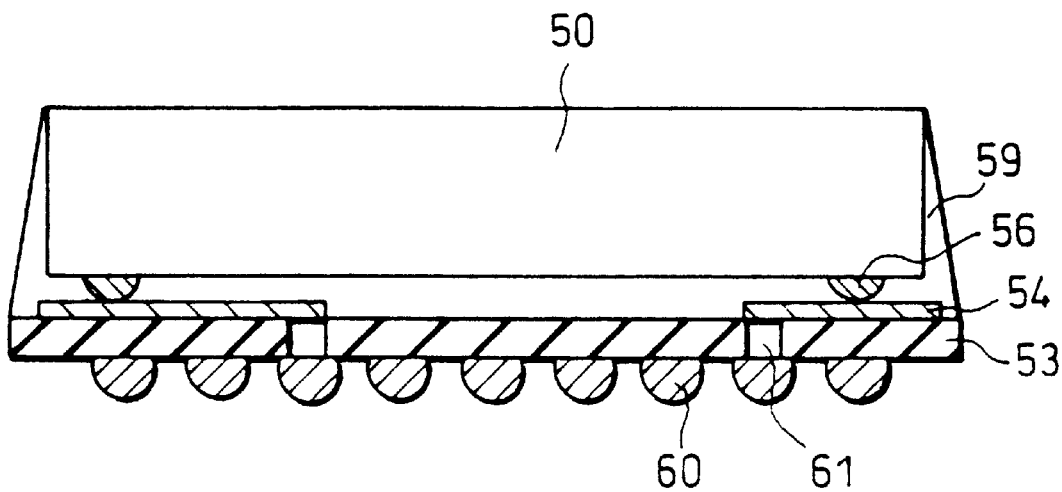
Figure 11A:
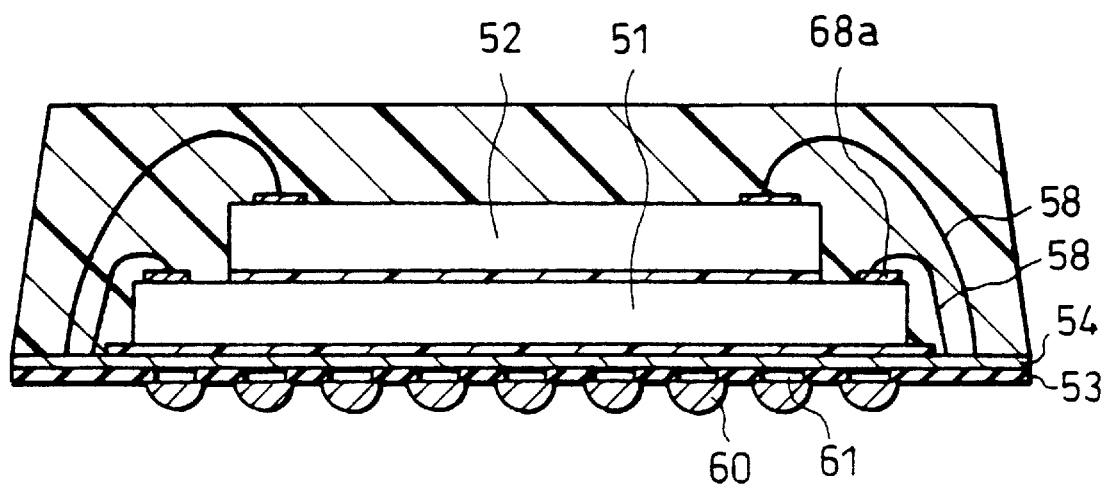
FIGS. 11(a) and 11(b) are cross-sectional views that show another conventional semiconductor device.
Figure 11B:
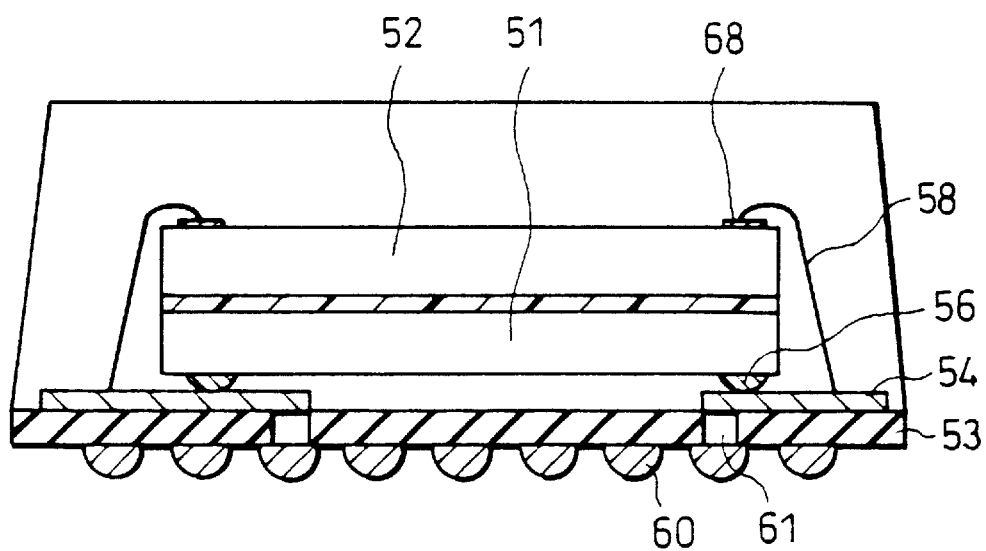

Lastly, as illustrated in FIG. 9(b), the first semiconductor chip 1, the second semiconductor chip 2, the wires 8 and the circuit substrate 3' are covered with a resin coat 9; thus, the semiconductor device of the packaging type of the present embodiment is complete.

Here, in lieu of the protrusion electrodes 6 made of Au of the first semiconductor chip 1, solder protrusion electrodes, made of solder containing Sn and Pb as its main components, may be formed. With respect to the method for forming the solder protrusion electrodes, a wire-bump method that is a modified wire bonding method using solder wires, and a supplying method by means of electrolytic plating have been known. In this case, Au plating is applied to the uppermost surface of the plane electrode of the circuit substrate 3'. Normally, the wiring material for the circuit substrate 3' is Cu, and after Au plating or Ni plating has been applied thereon, the Au plating is further applied thereon.

In the manufacturing method of the semiconductor device of the present invention in which the first semiconductor chip is flip-chip bonded to the circuit substrate with the second semiconductor chip being bonded to a rear face of the first semiconductor chip and the second semiconductor chip being bonded to the circuit substrate by means of wire-bonding, in the case when at least one side of outer edges of the second semiconductor chip protrudes from outer edge of the first semiconductor chip, upon flip-chip bonding the first semiconductor chip to the circuit substrate, a bonding agent is interpolated between the first semiconductor chip and the circuit substrate with one portion of the bonding agent protruding between the first semiconductor chip and the circuit substrate, and the height of the protruding bonding agent is adjusted to the same level as the rear face of the first semiconductor chip so as to form a support portion for the protruding portion of the semiconductor chip.

In accordance with the above-mentioned method, in the case when at least one side of the outer edges of the second semiconductor chip protrudes from the outer edge of the first semiconductor chip, upon flip-chip bonding the first semiconductor chip to the circuit substrate, a bonding agent, which is interpolated between the first semiconductor chip and the circuit substrate, is utilized to form a support portion for the protruding portion of the semiconductor chip.

Therefore, even to an electrode formed on the protruding portion, a sufficient load and ultrasonic waves can be applied at the time of wire-bonding without damaging the second semiconductor chip by the impact and load.

With this arrangement, not to mention the combination of semiconductor chips with one located above being greater than the other located below, any combination, such as a combination of a square and a rectangle that inevitably causes one to protrude from the other and a combination of an extremely small one and the other one, which might cause wire flow and short-circuiting with the semiconductor chip located below even when the smaller one is placed above, may be adopted without raising any problems at the time of packaging with an arrangement so as to place the extremely smaller one below. Therefore, in a semiconductor device having an arrangement for achieving a high density by stacking a plurality of semiconductor chips, it is possible to improve the degree of freedom in designing the semiconductor device.

Moreover, it is not necessary to provide a new member separately so as to form the support portion for the protruding portion of the second semiconductor chip, and the support portion is easily formed by a simple process in which a bonding agent, used at the time of flip-chip bonding the first semiconductor chip to the circuit substrate, is adjusted in its amount, and the precision of the height of the support portion is readily maintained by adopting a manufacturing method of the present invention, for example, as described below.

The height of the protruding bonding agent that forms the support portion may be adjusted by the suction face of the suction support member for sucking and supporting the first semiconductor chip at the time of flip-chip bonding the first semiconductor chip.

If the support portion is extremely lower than the rear face of the first semiconductor chip, it fails to stably support the protruding portion of the second semiconductor chip, and in contrast, if it is too high, it gives an excessive load; therefore, the support portion needs to be set to the same level as the rear face of the second semiconductor chip.

In the above-mentioned method, the suction face of the suction support member for sucking the first semiconductor chip from the rear face side that is a jig used for flip-chip bonding the first semiconductor chip to the circuit substrate is utilized for adjusting the height of the protruding bonding agent to the same level as the rear face of the first semiconductor chip; therefore, the adjustment of the height of the bonding agent forming the support portion is positively carried out with ease, and the above-mentioned manufacturing method is thus easily realized.

In the manufacturing method for the semiconductor device of the present invention, the suction face of the suction support member may be subjected to a treatment for improving the separating property from the bonding agent.

In the above-mentioned method, since the treatment for improving the separating property from the bonding agent is applied to the suction face of the suction support member, the suction support member is easily separated from the bonding agent after the first semiconductor chip has been bonded to the circuit substrate. For example, a coat film made of fluororesin may be formed so as to improve the separating property from the bonding agent.

In the manufacturing method of the semiconductor device of the present invention, prior to flip-chip bonding the first semiconductor chip onto the circuit substrate, the first semiconductor chip and the second semiconductor chip may be bonded to each other so that the protruding bonding agent serving as the support portion is adjusted in its height by using the protruding portion of the second semiconductor chip.

In accordance with the above-mentioned method, the first semiconductor chip and the second semiconductor chip are preliminarily bonded to each other so that upon flip-chip bonding the first semiconductor chip to the circuit substrate, the protruding bonding agent which forms the support portion is adjusted in its height directly by the protruding portion of the second semiconductor chip; therefore, it is possible to positively adjust the protruding bonding agent to the same level as the rear face of the first semiconductor chip with ease, and also to carry out the manufacturing process without applying any machining process to the conventionally-used jig.

In the manufacturing method of a semiconductor device of the present invention, a bonding agent which has a paste form or a liquid form, or is allowed to flow upon application of heat may be used so as to bond the first semiconductor chip and the second semiconductor chip, and a fillet may be formed on the peripheral edges of the first semiconductor chip.

In accordance with the above-mentioned method, since the first semiconductor chip and the second semiconductor chip are bonded to each other by using the bonding agent which has a paste form or a liquid form, or is allowed to flow upon application of heat, and the fillet is formed on the peripheral edges of the first semiconductor chip; this makes smoother the flow of the bonding agent that is extruded so as to protrude upon flip-chip bonding the first semiconductor chip to the circuit substrate at the post processing. The resulting effects are prevention of bubble inclusion, a reduction in the occurrence of voids and a subsequent improvement in the yield.

In the manufacturing method of a semiconductor device of the present invention, a thermo-setting bonding agent may be used as the bonding agent that is applied at the time of flip-chip bonding the first semiconductor chip to the circuit substrate.

In accordance with the above-mentioned method, since the bonding agent, used for flip-chip bonding the first semiconductor chip to the circuit substrate, is allowed to have a thermo-setting property, the support portion becomes more resistant to heat. Therefore, even if wire bonding is applied to the portion of the second semiconductor chip supported by the support portion, the support portion is free from softening caused by the resulting heat and ultrasonic waves. Thus, it is possible to stably support the second semiconductor chip, and consequently to carry out a better wire bonding process.

In the manufacturing method of the semiconductor device of the present invention in which the first semiconductor chip is flip-chip bonded to the circuit substrate with the second semiconductor chip being bonded to the rear face of the first semiconductor chip and the second semiconductor chip being bonded to the circuit substrate by means of wire-bonding, in the case when at least one side of the outer edges of the second semiconductor chip protrudes from the outer edge of the first semiconductor chip, a portion under the protruding portion of the second semiconductor chip is filled with a bonding agent that bonds the first semiconductor chip and the circuit substrate.

In the above-mentioned arrangement, since the portion under the portion of the upper second semiconductor chip (protruding portion) protruding from the lower first semiconductor chip is filled with the bonding agent used for flip-chip bonding the first semiconductor chip to the circuit substrate, wire bonding is stably carried out on electrodes formed on the protruding portion of the second semiconductor chip.

In other words, with the above-mentioned arrangement, even when one portion of the upper second semiconductor chip protrudes from the lower first semiconductor chip, it is possible to place electrodes on the protruding portion.

Consequently, in a semiconductor device on which two laminated semiconductor chips are packaged, it is possible to use various combinations of sizes in semiconductor chips such as a combination of a rectangle one and a square one or a combination between those having an extreme size difference.

Therefore, in a semiconductor device having an arrangement for achieving a high density by stacking a plurality of semiconductor chips, it is possible to improve the degree of freedom in designing the semiconductor device.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device comprising:
    a first semiconductor chip connected to a circuit substrate by using a bonding agent with an active face thereof facing the circuit substrate;
    a second semiconductor chip having a protruding portion sticking out from the first semiconductor chip with a back face thereof being bonded to a back face of the first semiconductor chip, the protruding portion being connected to the circuit substrate with a wire; and
    a support portion, formed by one portion of the bonding agent, for supporting the protruding portion.

2. The semiconductor device as defined in claim 1, wherein an anisotropic conductive bonding agent is used as said bonding agent.

3. A semiconductor device comprising:
    a first semiconductor chip that is flip-chip bonded to a circuit substrate with a second semiconductor chip being bonded to a back face of the first semiconductor chip, the second semiconductor chip being bonded to the circuit substrate by means of wire-bonding,
    wherein: at least one side of outer edges of the second semiconductor chip protrudes from an outer edge of the first semiconductor chip, and a portion under a protruding portion of the second semiconductor chip is filled with a bonding agent that bonds the first semiconductor chip and the circuit substrate.

4. The manufacturing method of a semiconductor device as defined in claim 3, wherein an anisotropic conductive bonding agent is used as said bonding agent.

* * * * *